United States Patent
Culp

[19]

[11] Patent Number: 5,241,235
[45] Date of Patent: Aug. 31, 1993

[54] TWISTING ACTUATORS

[75] Inventor: Gordon W. Culp, Van Nuys, Calif.

[73] Assignee: Rockwell International Corporation, Seal Beach, Calif.

[21] Appl. No.: 931,460

[22] Filed: Aug. 21, 1992

Related U.S. Application Data

[63] Continuation of Ser. No. 708,643, May 31, 1991, abandoned.

[51] Int. Cl.$^5$ .............................................. H01L 41/08
[52] U.S. Cl. ................................. 310/328; 310/332; 310/333
[58] Field of Search ................ 310/328, 330, 332, 333

[56] References Cited

U.S. PATENT DOCUMENTS

| | | | |
|---|---|---|---|
| 2,515,446 | 7/1950 | Gravley | 310/328 |
| 2,928,069 | 3/1960 | Petermann | 310/328 |
| 3,940,974 | 3/1976 | Taylor | 310/328 |
| 4,649,313 | 3/1987 | Ogawa et al. | 310/358 |
| 4,652,286 | 3/1987 | Mishiro | 310/328 |
| 4,728,843 | 3/1988 | Mishiro | 310/325 |
| 4,764,702 | 8/1988 | Mighiro | 310/323 |
| 4,812,697 | 3/1989 | Mishiro | 310/323 |
| 4,868,447 | 9/1989 | Lee et al. | 310/328 |
| 4,905,107 | 2/1990 | Klein | 310/333 |
| 4,928,030 | 5/1990 | Culp | 310/328 |
| 4,933,590 | 6/1990 | Inoue et al. | 310/323 |
| 4,947,076 | 8/1990 | Kumada | 310/323 |

FOREIGN PATENT DOCUMENTS

| | | | |
|---|---|---|---|
| 2219735 | 1/1992 | Fed. Rep. of Germany | 310/333 |
| 20775 | 2/1985 | Japan | |
| 0204271 | 10/1985 | Japan | 310/332 |
| 274894 | 11/1988 | Japan | |
| 0573828 | 9/1977 | U.S.S.R. | 310/328 |

OTHER PUBLICATIONS

Technical Reference EMDUSM-8703 "Ultrasonic Motor" Panasonic Industrial Co., Electric Motor Division of Matsushita Industrial Co., Ltd., Osaka, Japan.

Primary Examiner—Mark O. Budd
Assistant Examiner—Thomas M. Dougherty
Attorney, Agent, or Firm—H. Fredrick Hamann; Harry B. Field; Steven E. Kahm

[57] ABSTRACT

This invention is for a single lamina twisting transducer made of an electrodeformable material. The twisting transducer has responsivity vectors which are curved or circular in nature so that when an electric field is applied the transducer will twist, exserting an angular force rather than a linear force as prior art transducers do. The twisting lamina can be stacked with a common electrode between them. The transducers can be used in actuators to provide angular forces in actuators. When combined in actuator stacks with linear transducers the actuator stack can be controlled in six degrees of freedom. Thus accurate moving and positioning of objects can be accomplished by use of such an actuator stack. Further since such an actuator stack is sensitive to accelerations in six degrees of freedom it can be used in making an accelerometer. Other uses for twisting actuators are for motors and rotational positioning of objects.

35 Claims, 3 Drawing Sheets

Twister

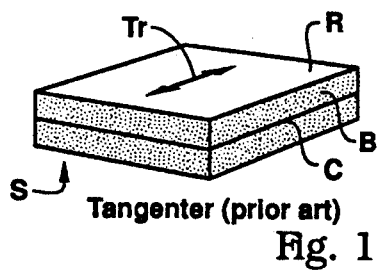
Fig. 1 Tangenter (prior art)
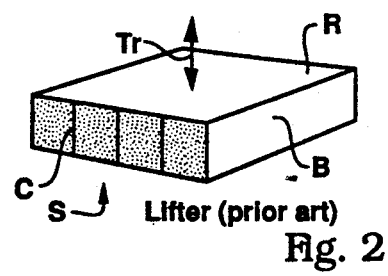
Fig. 2 Lifter (prior art)
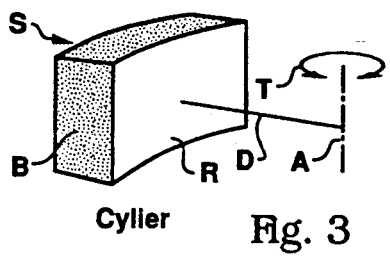
Fig. 3 Cylier
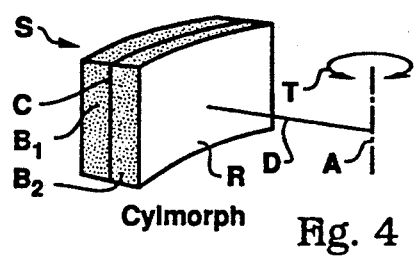
Fig. 4 Cylmorph
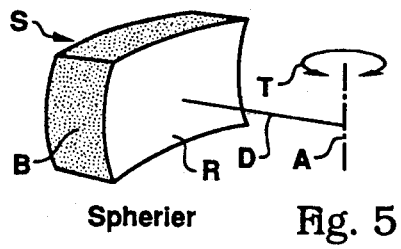
Fig. 5 Spherier
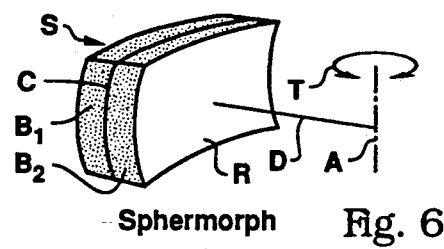
Fig. 6 Sphermorph
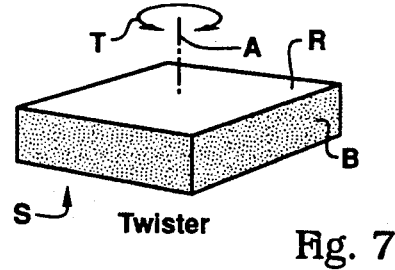
Fig. 7 Twister
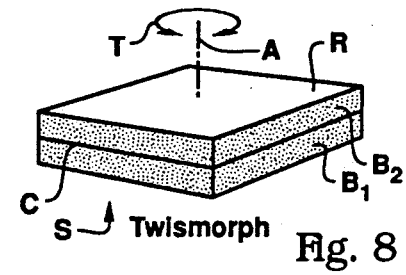
Fig. 8 Twismorph
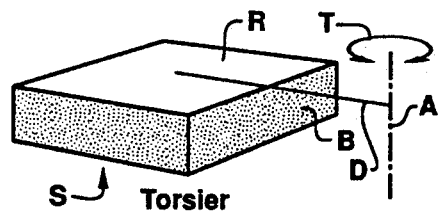
Fig. 9 Torsier
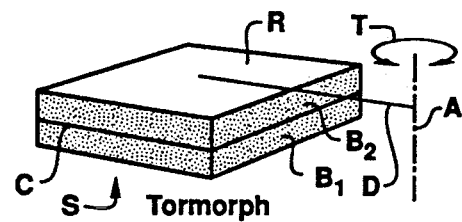
Fig. 10 Tormorph
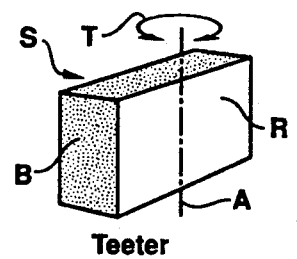
Fig. 11 Teeter
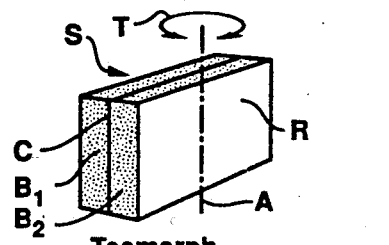
Fig. 12 Teemorph

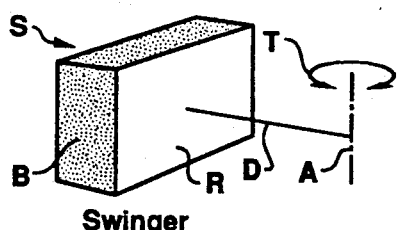
Fig. 13 Swinger
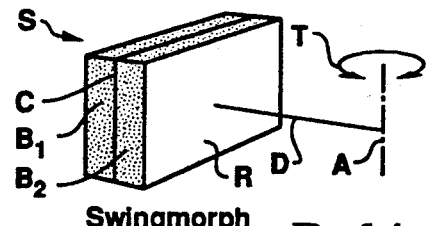
Fig. 14 Swingmorph
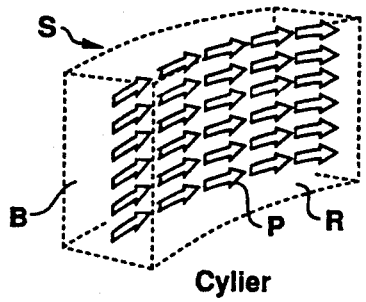
Fig. 15 Cylier
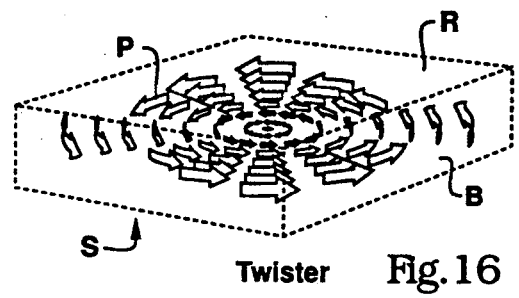
Fig. 16 Twister
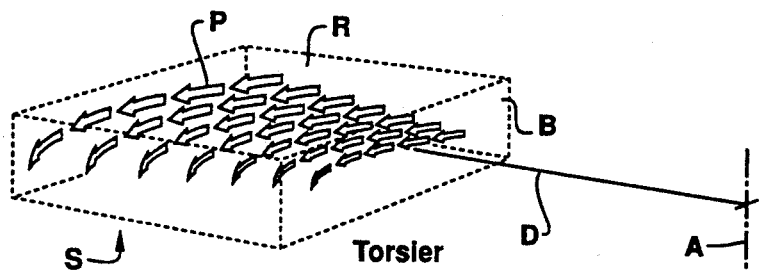
Fig. 17 Torsier
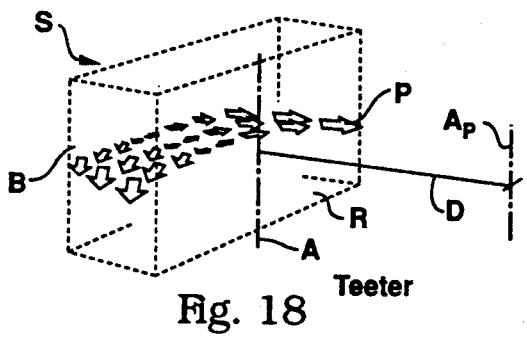
Fig. 18 Teeter
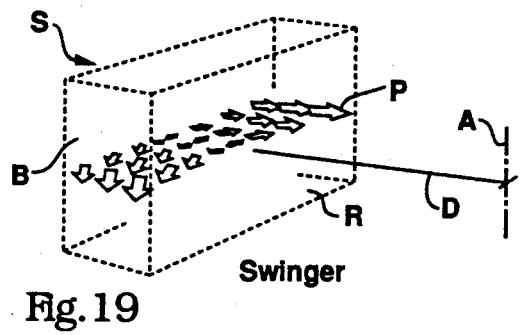
Fig. 19 Swinger
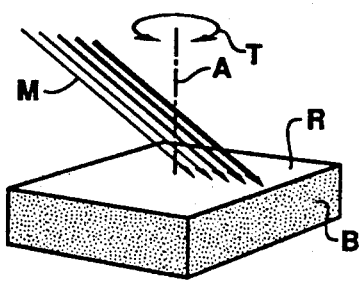
Fig. 20
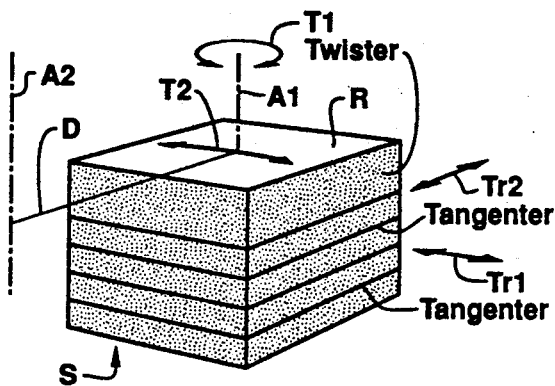
Fig. 21 Tangenter

TWISTING ACTUATORS

This is a continuation of copending application Ser. No. 07/708,643 filed on May 31, 1991 now abandoned.

BACKGROUND OF THE INVENTION

1. Field of the Invention

The present invention generally relates to electromechanical transducers and, in particular, to transducers that directly convert an electrical signal into rotational mechanical action.

2. Background Art

In one of applicant's prior patents, U.S. Pat. No. 4,928,030, he describes electromechanical actuators that combine lifters and tangenters, which respectively translate a responsive surface perpendicular to, and in the plane of, the responsive surface in response to separate electrical signals. The mechanical strokes of the described transducers are linear. Compound transducers are taught that combine tangenters and lifters in various ways to provide one, two, and three linear motions. Devices such as linear, rotary, and combined linear and rotary motors are described. Also described are the methods of positioning an object with single and compound linear actuators using traction and release with substantially differing velocities, and using walking without sliding between each actuator's traction surface (crown) and the walked surface of the positioned object. The rotary motors have no gross sliding. They use a rolling line contact in which contact pressure is relatively high, and at which microrubbing is unavoidable. Other taught motors allow sliding by a twisting action between the crown and the traction surface of the positioned object. Gross twisting sliding and rolling microrubbing reduce electromechanical efficiency by dissipating a portion of the available electrical power as frictional heat, and shorten the life of the motors by wearing the traction surfaces.

Applicant's copending application, Ser. No. 07/488,548 filed Mar. 15, 1990 teaches an electrical drive means that elicits a nonsinusoidal walking mechanical waveform from the responsive surface of an electrically segmented transducer, taught benefits being increased mechanical efficiency due to reduced gross sliding during walking positioning of an object, and increased electrical efficiency due to electrical but not necessarily electromechanical resonance. The teachings are generally applicable to the preponderance of electrically segmented electrodeformable transducers, and particularly to walking transducers. The teachings are directed primarily toward transducers that produce linear strokes, but are considered to be encompassed by the scope of the present invention because the advantages of these teachings apply equally to twisting as well as to linear transducers. By way of example, a transducer walks a curved path with greatest efficiency when its "ankle" twists by an amount predicated on the rotation subtended by a step of the curving path. An improper amount of twist results in some combination of ankle strain and sole wear. Highly efficient walking is most effectively achieved by both linear and, by inference, by rotary nonsinusoidal mechanical stroke waveforms.

In Technical Reference EMDUSM-8703 "Ultrasonic Motor" Panosonic Industrial Co. describes an ultrasonic traveling wave motor that is representative of a diverse class of devices, all known embodiments of which use electromechanical resonance to improve electrical efficiency. However, the vibration of mechanical resonance is characteristically sinusoidal, resulting in an elliptical output stroke. Contact of the rotor surface with wave crests of an elliptically oscillating vibrator entails contact sliding to the extent that more than half of the applied electrical power is dissipated as frictional heat. The rubbing engenders a relatively short contact surface life due to wear. The preponderance of ultrasonic traveling wave motors hold the stationary resonant wave plate against the rotating plane surface of a disk rotor, causing twist rubbing that adds wear and frictional heat generation to that resulting from the elliptical contact motion.

Japanese patent 63-274,894 to Uozumi describes two-axis electrodeformable transducers that use a walking action to position a tunneling electron microscope stage in three directions, but primarily in two directions in the plane of the sample. The reference also describes a motor having 12 similar transducers that walk the broad planar surface of a rotated disk in alternating groups. Each described transducer provides two linear motions, one normal to the plane of the disk, and another tangential to the disk axis. However, during each traction portion of a walking step, the surface of the disk rotates while the transducer executes linear translations, thus producing a first rubbing that is radial due to a minute change in radius that is the difference between a tangential stroke and a truly annular stroke, and a second rubbing caused by differential twist between the linear transducer and the rotating disk surface. Rubbing reduces electromechanical efficiency through frictional dissipation, and reduces life due to wear.

Japanese patent 60-20,775 Ogiso, describes a piezoelectric motor having six, two-axis transducers that walk the cylindrical surface of a rotor in alternating groups. The traction member (10) of each walking transducer has a plane traction surface that is forcefully positioned in a first radial direction relative to the rotor axis, and in a second direction tangential to the cylindrical surface of the rotor. Activation of the motor is described in a context of electromechanical transducer resonance that positions any point of the plane of the traction surface along an elliptical path, but does not rotate the plane. The rotor is rolled between opposing traction members, the rolling occurring at line contacts between the planes of the traction members and the rotor's cylindrical surface. Relying on traction, the generable tangential force is less than or equal to the product of the radial force and the traction transducers can be used in actuators to provide angular forces in coefficient of nonsliding friction. Extraction of significant torque from a motor of this type entails relatively large radial forces which, in the area immediately surrounding the line contact, causes compressive and shear stresses that easily approach the endurance limits of most materials. An ideal motor of cylinder rotor type may use a traction member having a contact surface that is a segment of a cylinder having the same curvature as the rotor, thus distributing the pressure due to radial force over the entire area of contact. Clearly, the two cylindrical surfaces must have coincident axes in order to assure a proper fit, and transducers that combine linear motions cannot provide coincidence at any position other than at the center of each walking stride.

Variants of walking motors and actuating devices having toothed traction surfaces, when only one of the toothed surfaces is curved, produce an actuation force that is limited because relatively few of the teeth are engaged at any particular phase of activation. Fewer teeth bear the operating load, thereby incurring a higher tooth pressure and stress that would otherwise prevail when all possible teeth were engaged and equally sharing the load.

U.S. Pat. No. 4,868,447 Lee et al, describes transducers made of polyvinylidene fluoride (PVDF) piezoelectric material laminated to other similar layers, or laminated to another body, in a manner that allows transduction by twisting and by bending. The polymer film taught (1:27): ". . . only generates normal stress and strain . . . ". Further, Lee et al teach (7:37): "However, due to the thin film shape of PVDF, the [shear] constants $d_{15}$ and $d_{24}$ remain unknown. Equation (7) reveals that by applying an electric field along the z-axis, only the normal strain will be induced. This explains why all previous applications of PVDF bimorph are primarily in the bending mode." Lee et al teaches a new composite piezoelectric theory (7:43 et seq) wherein (15:63) ". . . it is desired to generate shear forces by normal stresses . . . " when a composite transducer is made of individual PVDF layers, each layer deforming solely in the extension mode, and in which the composite, as a whole, detects or actuates compound bending and twisting by the interaction of the extension of a first extension layer with the extension of a second extension layer angularly disposed to the extension of said first extension layer. Lee et al teach that twist is the sum of two bending deformations due to extensions of at least two angularly disposed broad surfaces, all of said broad surface being deformed, that is, not having the quiescent shapes of the broad surfaces preserved, during twist.

Lee et al describe a pure torsion embodiment of the laminated transducer (29:4) that requires at least two piezoelectric layers and a sandwiched inert shim layer. Lee et al teach that the twist occurs about a normal of the plane containing the narrow end edge of the laminate (6:2 and FIG. 1), this normal being the axis of least stiffness. Lee et al allude to stresses internal to the taught laminate (12:21): ". . . each lamina that has its own displacement and can be related to the displacement of the other laminae by inter-lamina boundary conditions . . . " indicates that strains achieved by laminates will always be of lesser magnitude than free-lamina strains because of the stressed interlaminar boundary conditions that prevail during both twist and bending relegate a portion of the otherwise available free-lamina transduction to the generation self-canceling internal stresses. The transduction losses due to interlaminar stress is sufficient to have fostered a literature of corrective measures, a representative being U.S. Pat. No. 4,649,313 Ogawa et al, which describes a buffer layer at or near the neutral fiber of a piezoelectric bending transducer, the buffer layer acting to ameliorate internal (shear, due to bending) stress to a prescribed limit, and thereby allow the transducer to dedicate a greater share of the transduction to desired displacement than would otherwise occur because of generally self-canceling interlaminar stresses.

The teachings of Lee et al include polarization of the piezoelectric material by applying an electric field across the thickness of the film, then activating the film by the application of an electric potential that induces an electric field in the same direction as prevailed during polarization (poling). It will be readily apparent to those versed in the particular art that the application of an activating potential to the film that results in an induced electric field comparable in strength to the original poling field, but in the opposite direction, may cause the original strength of poling to be reduced, cancelled, and in extreme cases, the poling may be partially or wholly reversed, resulting in a transducer that responds in the opposite sense as originally intended. Therefore, the transducers of Lee et al are limited, under these conditions, to essentially monopolar electric drive.

Claimed by Lee et al (claim 11) is polarization" . . . wherein the polarization profile of each lamina is varied in magnitude and direction to vary the response characteristics of the lamina." The corresponding teachings of Lee et al define profile as separate areas of a lamina, any one area having a single uniform polarization in one of two possible directions, either perpendicular and into a top side, or perpendicular to and out of a top side. The corresponding teaching defines "response" in this context as the dynamic response to a particular mode of oscillation of the lamina and attached structure, for example, to sense "mode 2" (37:11 et seq). The corresponding teachings define varied in magnitude as full positive, full negative, or zero, in accordance with the particular area of the profile. Smoothly varying the magnitude from one value to another value in a particular area is not taught, and would serve no identified purpose in the context of a profile designed to be responsive to a particular vibrational mode. Directions of polarization other than normal positive and normal negative relative to a top surface are not taught. Lee et al teach the polarization of piezoelectric polymer films using mechanical means in combination with electrical means. Means of smoothly varying magnitude and direction of polarization, other than in the afore referenced magnitudes and directions, are not taught by Lee et al, and further, are prohibited by the mechanical-electrical nature of the piezoelectric polymer polarization process. Therefore PVDF, the most common and representative piezoelectric polymer, is excluded from the shear class of electrodeformable transducer materials.

The teachings of Lee et al are clearly distinguishable from those of the present invention by the following differences:

In Lee et al, the transducer laminate is made of extension mode material, thickness mode material, or at least two extension mode materials mutually angularly disposed (whereas in the present invention, a body portion is made of shear electrodeformable material);

In Lee et al, the broad surfaces are deformed during deformation (whereas in the present invention, a layer, including the layer with the thin film shape, produces a twist of one broad surface relative to the opposite broad surface while essentially preserving the shape of both broad surfaces);

In Lee et al, a portion of the transduction is relegated to self-canceling internal stresses that reduce the transduction that would otherwise be available if said internal stresses did not obtain (whereas in the present invention, because the shapes of broad surfaces of a single layer remain undeformed by twist, the layer produces the same fullness of transduction in the free layer as is produced in a layer having one or both broad surfaces attached to other layers, or attached to other rigid members);

In Lee et al, twist is achieved by combining two or more extensions having relative angular disposition (whereas in the present invention, twist is produced by shear deformation of a single layer without recourse to ancillary structures);

In Lee et al, electric drive is limited to essentially monopolar drive (whereas in the present invention the use of shear electrodeformable material permits bipolar electric drive and therefore provides at least twice the total transduction with equivalent comparable magnitude of strain and stress);

In Lee et al, the polarization of a lamina has a profile, that is, each areal portion of a lamina may have a separate but uniform direction and magnitude of polarization (whereas an embodiment of the present invention smoothly varies the polarization over the entire area of a lamina because a profile consisting of separate uniformly polarized areas serves no purpose defined by the present invention);

In Lee et al, the polarization is varied in direction, said direction being perpendicular into and perpendicular out of a top surface (whereas in the present invention the direction of polarization is varied smoothly from one direction at one portion of a layer to another direction at another portion of the layer);

In Lee et al, the polarization is varied in magnitude, said magnitude being full positive, full negative, and zero relative to a top surface (whereas the present invention smoothly varies the magnitude of polarization from a first value at a first location of the layer to a second value at a second location of the layer); and In Lee et al, twist occurs about a normal of the plane containing the narrow end (or side) edge of the laminate, this normal being the axis of least torsional stiffness (whereas twist of the present invention occurs about the normal to a broad surface, the stiffest twisting axis).

SUMMARY OF THE INVENTION

The present invention is for a class of twisting transducers which provides rotation as well as translation, allowing the forceful and accurate positioning of a responsive surface, and consequently of a positionable object, with any combination of one through six degrees of motional freedom. Composite twisting transducers provide more than six degrees of freedom insofar as each motion is independently electrically addressable, and arbitrarily curved paths are tracable, for example, noncircular rotation about an axis while the distance to and direction of the axis is simultaneously changed. Methods of making twisting transducers and composites thereof from electrodeformable material employ a nonuniform distribution of the positions, directions, and magnitudes of responsivity vectors. Other methods use a nonuniform distribution of the intensity of an applied electric signal. Variants of the methods use combinations of: sample rotation during fabrication; assemblies of presensitized segments; and uniform responsivity distribution followed by a predetermined nonuniformity of desensitization. Twisting transducers improve mechanical efficiency and life of machines having rotating components by obviating twist sliding, rolling microrubbing, and high contact pressures. Optical components and other delicate objects are positioned with six degrees of freedom without altering the state of strain therein.

The invention can also be used in an accelerometer. The layers in the stack being sensitive to the acceleration of the stack in six degrees of freedom. Sensors can detect the movement of the stack and current can be applied to the layers to bring them back into alignment with their at rest position. The current needed to bring the stack into alignment is directly related to the force of acceleration placed on the stack.

The principal object of the present invention is to produce twisting mechanical action in electrodeformable material.

Another object of the present invention is using transducers of twisting electrodeformable material singly and in various combinations to forcefully and accurately position an object with high mechanical efficiency.

A further object is to position an object with any combination of one to six of motional degrees of freedom using a transducer composed in part of twisting transducer components.

Other objects, advantages and novel features of the present invention will become apparent from the following detailed description of the invention when considered in conjunction with the accompanying Drawings.

BRIEF DESCRIPTION OF THE DRAWINGS

FIG. 1 is a perspective view of a tangenter dimorph.
FIG. 2 is a perspective view of a lifter stack.
FIG. 3 is a perspective view of a cylier.
FIG. 4 is a perspective view of a cylmorph.
FIG. 5 is a perspective view of a spherier.
FIG. 6 is a perspective view of a sphermorph.
FIG. 7 is a perspective view of a twister.
FIG. 8 is a perspective view of a twismorph.
FIG. 9 is a perspective view of a torsier.
FIG. 10 is a perspective view of a tormorph.
FIG. 11 is a perspective view of a teeter.
FIG. 12 is a perspective view of a teemorph.
FIG. 13 is a perspective view of a swinger.
FIG. 14 is a perspective view of a swingmorph.
FIG. 15 is a perspective view of the responsivity in a cylier.
FIG. 16 is a perspective view of the responsivity in a twister.
FIG. 17 is a perspective view of the responsivity in a torsier.
FIG. 18 is a perspective view of the responsivity in a teeter.
FIG. 19 is a perspective view of the responsivity in a swinger.
FIG. 20 is a schematically illustrates a typical rotary transducer segment during manufacture receiving incident energy to set the responsivity of the material.
FIG. 21 is a perspective view of a stack of transducer segments having two tangenters and a twister.

DETAILED DESCRIPTION

Figure 22:
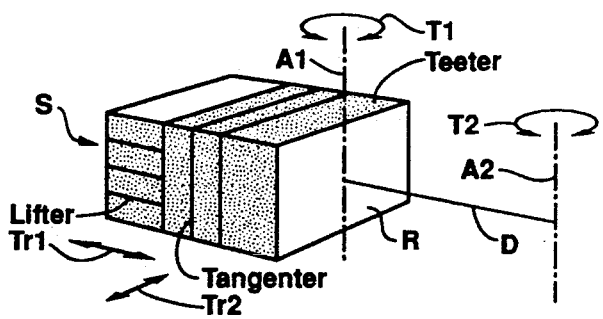
FIG. 22 is a perspective view of a stack of transducer segments having a lifter, a tangenter and a teeter.

FIG. 1 is a perspective view of a prior art tangenter, a transducer that acts in a tangential direction in response to an electric signal. The transducer comprises a body B having an output surface R opposite a stationary surface S, the latter generally considered as remaining stationary for reference. Applying an electrical signal to the input C of the transducer causes surface R to translate in directions Tr parallel to and relative to stationary surface S. Transducer body B is made of electrodeformable material. When the electrodeformable material is of the shearing type, translation Tr is not generally accompanied by other deformations or changes of shape. A body composed of a different electrodeformable material may affect translation Tr in combination with one or more other deformations or changes of shape. Shearing electrodeformable material is preferred for tangenters because no portion of the tangential stroke or force is needed for other deformations. The illustrated tangenter has a dimorph electrical configuration, the dimorph having active electrical portions interior to body B, and having external electrical portions maintained at electrical ground. Grounded external surfaces allow assembly of dimorph tangenters with other objects without regard for the electrical state thereof.

Letter designations of transducer portions and actions are generally carried through in a consistent manner for subsequent detailed description. Each transducer is represented by two forms, a single body component form that may have an electrical connection on an external surface, and a form generally suffixed -morph having external surfaces that do not participate electrically in the activation of the transducer. The -morph transducer configurations are generally made by assembling two single bodied transducer elements so that the activated electrical connection lies interior to the assembled body.

The term "dimorph configuration" extends the use of the term "dimorph," originally coined in applicant's prior U.S. Pat. No. 4,928,030, incorporated here by reference, to describe a linear shearing transducer element having at least two opposite broad surfaces that remain electrically neutral and mechanically bondable without regard to the electrical state of the material to which bonded, is herein extended to include a diverse set of twisting and turning transducers that are likewise bondable. Dimorph transducers are herein treated as fundamental transducer building blocks that are bondable to each other, to other members of the set, and to support means in any order while preserving the electrically independent addressability of each dimorph.

FIG. 2 is a perspective view of a prior art lifter, a transducer that acts in a direction perpendicular to a broad surface in response to an electrical signal. The transducer comprises a body B having an output surface R opposite a stationary surface S, the latter generally considered as remaining stationary for reference. Applying an electrical signal to the input C of the transducer causes surface R to translate in directions Tr perpendicular to and relative to stationary surface S. Transducer body B is made of electrodeformable material. When the electrodeformable material is of the shearing type, Translation Tr is not generally accompanied by other deformations or changes of shape. Body B composed of a different electrodeformable material may affect translation Tr in combination with one or more other deformations or changes of shape. Shearing electrodeformable material is preferred for lifters because no portion of the lifting stroke or force is needed for other deformations. The illustrated lifter has a dimorph electrical configuration, the dimorph having active electrical portions interior to body B, and having external electrical portions, if any, maintained at electrical ground. Grounded external surfaces allow assembly of dimorph lifters with other objects without regard for the electrical state thereof.

Although the term "shear" is commonly defined as linear translation of a first plane parallel to itself and relative to a second (assumed stationary) plane that is parallel to the first plane, both planes transecting a portion of a solid substance, the term is herein defined to further include curved planes and curved translation, the curvature being a slowly changing variable. The sense of slowly changing curvature is herein defined as that curvature that, considered from the perspective of microscopic examination of the causes of shear, behaves like, and is generable by the same mechanisms as, the aforementioned commonly defined linear translation of shear. In other words, an infinitesimal element of a curved-shearing solid substance would appear to be undergoing essentially the same degree of shear as an adjacent infinitesimal element, when the curvature is a slowly changing parameter.

FIG. 3 is a perspective view of a cylier, a transducer that acts in a cylindrical or annular direction relative to a broad surface in response to an electric signal. The transducer comprises a lamina of a cylinder segment body B having an output surface R opposite a stationary surface S, the latter generally considered as remaining stationary for reference. Applying an electrical signal to an input (not shown) of the transducer causes surface R to turn in directions T relative to stationary surface S about axis A that is located distance D from surface R. Body B is made of electrodeformable material. When the electrodeformable material is of the shearing type, turning stroke T is not generally accompanied by other deformations or changes of shape. Body B composed of a different electrodeformable material may affect turning stroke T in combination with one or more other deformations or changes of shape. Shearing electrodeformable material is preferred for cyliers because no portion of the cylindrical stroke or force is needed for other deformations. The illustrated cylier does not have a dimorph electrical configuration, requiring additional electrical insulation when assembling such cyliers to other components.

FIG. 4 is a perspective view of a cylmorph, a transducer that acts in a cylindrical or annular direction relative to a broad surface in response to an electric signal. The transducer comprises a lamina of a cylinder segment body B1, B2 having an output surface R opposite a stationary surface S, the latter generally considered as remaining stationary for reference. Applying an electrical signal to input C of the transducer causes surface R to turn in directions T relative to stationary surface S about axis A that is located distance D from surface R. Body B1, B2 is made of electrodeformable material. When the electrodeformable material is of the shearing type, turning stroke T is not generally accompanied by other deformations or changes of shape. Body B1, B2 composed of a different electrodeformable material may affect turning stroke T in combination with one or more other deformations or changes of shape. Shearing electrodeformable material is preferred for cylmorphs because no portion of the turning stroke or force is needed for other deformations. The illustrated cylmorph has a dimorph electrical configuration, the dimorph having active electrical portions interior to body B, and having external electrical portions maintained at electrical ground. Grounded external surfaces allow assembly of cylmorphs to other objects without regard to the electrical state thereof. By way of example, cylmorph transducers made of piezoelectric shear material may have a central electrode C separating body portions B1 and B2, these portions contributing respective cylindrical stroke portions to the whole stroke of the transducer.

FIG. 5 is a perspective view of a spherier, a spherical segment transducer that turns a broad spherical segment surface in response to an electric signal. The transducer comprises a lamina of a spherical segment body B having an output surface R opposite a stationary surface S, the latter generally considered as remaining stationary for reference. Applying an electrical signal to an input (not shown) of the transducer causes surface R to turn in directions T relative to stationary surface S about axis A that passes through or near the center of spherical curvature. Body B is made of electrodeformable material. When the electrodeformable material is of the shearing type, turning stroke T is not generally accompanied by other deformations or changes of shape. Body B composed of a different electrodeformable material may affect turning stroke T in combination with one or more other deformations or changes of shape. Shearing electrodeformable material is preferred for spheriers because no portion of the turning stroke or force is needed for other deformations. The illustrated spherier does not have a dimorph electrical configuration and may require additional electrical insulation when assembling to other components. Electromechanical behavior of the spherier is similar to that of the cylier (FIG. 3).

FIG. 6 is a perspective view of a sphermorph, a transducer that turns a broad spherical segment surface in response to an electric signal. The transducer comprises laminae of a spherical body of segments B1 and B2 having an output surface R opposite a stationary surface S, the latter generally considered as remaining stationary for reference. Applying an electrical signal to input C of the transducer causes surface R to turn in directions T relative to stationary surface S about axis A that passes through or near the center of spherical curvature. Body B1, B2 is made of electrodeformable material. When the electrodeformable material is of the shearing type, turning stroke T is not generally accompanied by other deformations or changes of shape. Body B1, B2 composed of a different electrodeformable material may affect turning stroke T in combination with one or more other deformations or changes of shape. Shearing electrodeformable material is preferred for sphermorphs because no portion of the turning stroke or force is needed for other deformations. The illustrated sphermorph has a dimorph electrical configuration, having external electrical portions maintained at electrical ground. Grounded external surfaces allow assembly of sphermorphs with other objects without regard to the electrical state thereof. Sphermorph transducers may have a central electrode C that divides the body into two portions B1 and B2, these portions contributing respective turning stroke portions to the whole stroke of the transducer.

FIG. 7 is a perspective view of a twister, a transducer that twists a broad surface in response to an electric signal. The transducer comprises body B having an output surface R opposite a stationary surface S, the latter generally considered as remaining stationary for reference. Applying an electrical signal to an input (not shown) of the transducer causes surface R to twist in directions T relative to stationary surface S about axis A that passes through some point of surface R, for example, the centroid of surface R. Body B is made of laminae electrodeformable material. When the electrodeformable material is of the shearing type, twisting stroke T is not generally accompanied by other deformations or changes of shape. It is emphasized that surface R does not change shape during twisting. Body B composed of a different electrodeformable material may affect twisting stroke T in combination with one or more other deformations or changes of shape. Shearing electrodeformable material is preferred for twisters because no portion of the twisting stroke or force is needed for other deformations. The illustrated twister does not have a dimorph electrical configuration and may require additional electrical insulation when assembling to other components.

FIG. 8 is a perspective view of a twismorph, a transducer that twists a broad surface in response to an electric signal. The transducer comprises laminae of body B1, B2 having an output surface R opposite a stationary surface S, the latter generally considered as remaining stationary for reference. Applying an electrical signal to input C of the transducer causes surface R to twist in directions T relative to stationary surface S about axis A that passes through some point of surface R, for example, the centroid of surface R. Body B1, B2 is made of electrodeformable material. When the electrodeformable material is of the shearing type, twisting stroke T is not generally accompanied by other deformations or changes of shape. As with the twister of FIG. 7, the shape of surface R remains unchanged during twisting. Body B1, B2 composed of a different electrodeformable material may affect twisting stroke T in combination with one or more other deformations or changes of shape. Shearing electrodeformable material is preferred for twisters because no portion of the twisting stroke or force is needed for other deformations. The illustrated twisting transducer has a dimorph electrical configuration, having external electrical portions maintained at electrical ground. Grounded external surfaces allow assembly of twismorphs with other objects without regard to the electrical state thereof. Twismorph transducers may have a central electrode C that divides the body into two portions B1 and B2, these portions contributing respective twisting stroke portions to the whole stroke of the transducer.

FIG. 9 is a perspective view of a torsier, a transducer that applies torsion to a broad surface in response to an electric signal. The transducer comprises body B having an output surface R opposite a stationary surface S, the latter generally considered as remaining stationary for reference. Applying an electrical signal to an input (not shown) of the transducer causes surface R to execute torsion relative to stationary surface S in directions T about axis A at distance D from some point of surface R, for example, the centroid of surface R. Body B is made of a lamina of electrodeformable material. When the electrodeformable material is of the shearing type, torsion T is not generally accompanied by other deformations or changes of shape, and the shape of surface R remains unchanged during torsion. Body B composed of a different electrodeformable material may affect torsion T in combination with one or more other deformations or changes of shape. Shearing electrodeformable material is preferred for torsiers because no portion of the torsion stroke or force is needed for other deformations. The illustrated torsier does not have a dimorph electrical configuration and may require additional electrical insulation when assembling to other components.

FIG. 10 is a perspective view of a tormorph, a transducer that applies torsion to a broad surface in response to an electric signal. The transducer comprises a body of two laminae B1 and B2 having an output surface R opposite a stationary surface S, the latter generally considered as remaining stationary for reference. Applying an electrical signal to input C of the transducer causes surface R to execute torsion relative to stationary surface S in directions T about axis A at distance D from some point of surface R, for example, from the centroid of surface R. Body portions B1 and B2 are made of electrodeformable material. When the electrodeformable material is of the shearing type, torsion T is not generally accompanied by other deformations or changes of shape, and the shape of surface R remains unchanged during torsion. Bodies composed of a different electrodeformable material may affect torsion T in combination with one or more other deformations or changes of shape. Shearing electrodeformable material is preferred for tormorphs because no portion of the torsion stroke or force is needed for other deformations. The illustrated tormorph has a dimorph electrical configuration wherein electrical input is confined to the interior of the body and external surface portions of the body remain at electrical ground, thereby allowing assembly to other components without regard to the electrical state thereof. The torsional stroke of the tormorph is composed of the sum of the stroke contributions of body portions B1 and B2.

FIG. 11 is a perspective view of a teeter, a transducer that applies a teetering motion to a broad surface in response to an electric signal. The transducer comprises body B having an output surface R opposite a stationary surface S, the latter generally considered as remaining stationary for reference. Applying an electrical signal to an input (not shown) of the teeter causes surface R to execute a teetering motion relative to stationary surface S in directions T about axis A that lies in surface R, for example, axis A may be the axis of gyration of surface R. Body B is made of a lamina of electrodeformable material. When the electrodeformable material is of the shearing type, teetering T is not generally accompanied by other deformations or changes of shape, and surface R retains its shape during teetering. Body B composed of a different electrodeformable material may affect teetering T in combination with one or more other deformations or changes of shape. Shearing electrodeformable material is preferred for teeters because no portion of the teetering stroke or force is needed for other deformations. The illustrated teeter does not have a dimorph electrical configuration and may require additional electrical insulation when assembling to other components.

FIG. 12 is a perspective view of a teemorph, a transducer that applies a teetering motion to a broad surface in response to an electric signal. The transducer comprises a body of laminae B1 and B2 having an output surface R opposite a stationary surface S, the latter generally considered as remaining stationary for reference. Applying an electrical signal to input C of the teemorph causes surface R to execute teetering relative to stationary surface S in directions T about axis A lying in surface R, for example, axis A may be the axis of gyration of surface R. Body portions B1 and B2 are made of electrodeformable material. When the electrodeformable material is of the shearing type, teetering motion T is not generally accompanied by other deformations or changes of shape, and surface R teeters without changing shape. Bodies composed of a different electrodeformable material may affect teetering T in combination with one or more other deformations or changes of shape. Shearing electrodeformable material is preferred for teemorphs because no portion of the teetering stroke or force is needed for other deformations. The illustrated teemorph has a dimorph configuration wherein electrical input is confined to the interior of the body while external surface portions of the body remain at electrical ground, thereby allowing assembly of the teemorph to other components without regard to the electrical state thereof. The teetering stroke of the teemorph is composed of the sum of the contributions of body portions B1 and B2.

FIG. 13 is a perspective view of a swinger, a transducer that applies a swinging motion to a broad surface in response to an electric signal. The transducer comprises body B having an output surface R opposite a stationary surface S, the latter generally considered as remaining stationary for reference. Applying an electrical signal to an input (not shown) of the swinger causes surface R to execute a swinging motion in directions T about axis A that lies at distance D from surface R. Thus surface R acts as if it were the seat of a childs swing. The surface remains flat and translates as if held by chains of length D, rotating about axis A. The surface can move either to the left or the right as indicated by the double arrowed direction indicator T in FIG. 13. Body B is made of a lamina of electrodeformable material. When the electrodeformable material is of the shearing type, swinging T is not generally accompanied by other deformations or changes of shape, and the shape of surface R does not change during swinging. Body B composed of a different electrodeformable material may affect swinging T in combination with one or more other deformations. Shearing electrodeformable material is preferred for swingers because no portion of the swinging stroke or force is needed for other deformations. The illustrated swinger does not have a dimorph electrical configuration and may require additional electrical insulation when assembled to other components.

FIG. 14 is a perspective view of a swingmorph, a transducer that applies a swinging motion to a broad surface in response to an electric signal. The transducer comprises a body of laminae B1 and B2 having an output surface R opposite a stationary surface S, the latter generally considered as remaining stationary for reference. Applying an electrical signal to input C of the swingmorph causes surface R to execute swinging relative to stationary surface S in directions T about axis A that lies parallel to and at distance D from surface R. Body portions B1 and B2 are made of electrodeformable material. When the electrodeformable material is of the shearing type, swinging motion T is not generally accompanied by other deformations. Bodies composed of a different electrodeformable material may affect swinging T in combination with one or more other deformations. Shearing electrodeformable material is preferred for swingmorphs because no portion of the swinging stroke or force is needed for other deformations. The illustrated swingmorph has a dimorph configuration wherein electrical input is confined to the interior of the body while external surface portions of the body remain at electrical ground, thereby allowing assembly of the swingmorph to other components without regard to the electrical state thereof. The swinging stroke T of the swingmorph is composed of the sum of the contributions of portions B1 and B2.

Responsivity and responsivity vectors are herein defined as the vector property of a solid transducer-forming substance that develops a vector action in response to an applied vector electric signal. The action includes any combination of deformation due to shear, due to a change in thickness, and due to a change in length. Throughout the Detailed Description it is further specified that all vectors associated with transducer responsivity are slowly varying parameters as previously defined, and any combination of these vectors may include curvilinearity.

FIG. 15 is a perspective view of an embodiment of the cylier transducer of FIG. 3, including body B having (reference) stationary surface S opposite responsive output surface R, with body B phantomed to show responsivity vectors P. Body B has the shape of a segment of a cylinder interior to the wall of which transducer responsivity vectors P are arranged to provide the action described for FIG. 3. When the body material is of the shear type, all vectors have equal magnitudes, when the wall is thin or radially graded magnitudes when the wall is thick, and each vector has a direction at each respective body locus that is generally tangential to the cylinder. The applied electrical signal interacts with the responsivity vectors to cause the described action. When cylier materials produce deformations of shearing in combination with other deformations, the directions of the responsivity vectors are arranged to produce a maximum portion of the action described for FIG. 3 while allowing a minimum of other deformations, thereby relegating the preponderance of action to that desired of the transducer. The preferred body material is piezoelectric.

An alternate embodiment of the cylier or cylmorph transducers using shear responsivity in combination with other deformations may employ progressively changing directions and magnitudes of the responsivity vectors in proportion to the distance from a line or plane.

The responsivity vectors for the spherier are the same as those for the cylier. The only difference is the cylier is a portion of a cylier and the spherier is a portion of a sphere. There is no gradient of responsivity vectors in either the cylier or the spherier.

FIG. 16 is a perspective view of the twister transducer of FIG. 7 having a body B with reference stationary surface S opposite responsive output surface R. Body B is phantomed to show an annular array of responsivity vectors P. Each vector P has at each respective point of the body a direction and magnitude that, in cooperation with an applied electric signal, causes surface R to twist as described for FIG. 7. When body B is made of shear material, and responsivity increases with distance from the axis of twist, and surface R twists without other deformation about the twist axis relative to surface S.

FIG. 17 is a perspective view of the torsier transducer of FIG. 9 having a body B with reference stationary surface S opposite responsive output surface R. Body B is phantomed to show an annular array of responsivity vectors P. Each vector has at each point of the body a direction and magnitude that, in cooperation with an applied electric signal, causes surface R to twist about axis A located distance D from body B. When body B is made of shear material, and responsivity increases with distance from a lesser value at the least distance D to a greater value at the extreme distance from axis A, causing surface R, without changing shape, to rotate about axis A. Magnitudes of responsivity vectors lying on a circle drawn about axis A are equal when shear is the sole transducer action. When deformations other than shear participate, the arrangement of responsivity vectors is altered to minimize non-shear deformations and stressful contentions that detract from the desired transducer action.

FIG. 18 is a perspective view of the teeter transducer of FIG. 11 having a body B with reference stationary surface S opposite responsive output surface R. Body B is phantomed to show one representative plane of an annular array of responsivity vectors P arranged cylindrically about axis Ap. Each vector has at each respective point of the body a direction and magnitude that, in cooperation with an applied electric signal, causes surface R to teeter about axis A located in the plane of surface R. The distance D between axis A and axis Ap depends on the direction and magnitude of deformation of the particular transducer body material. Thus surface R acts as if it were the board of a childs teeter totter. The surface remains flat and translates as if balanced on axis A, rotating about axis A. The surface can move either to the left or the right as indicated by the double arrowed direction indicator T in FIG. 11. When body B is made of shear material, the responsivity increases with distance from a lesser, and alternatively, a zero, value at the dividing plane containing axes A and Ap, to a greater value at the extreme distances at each side of the dividing plane, while at the same time responsivity decreases monotonically with the distance from axis Ap. This causes surface R to teeter about axis A without other deformation.

FIG. 19 is a perspective view of the swinger transducer of FIG. 13 that is similar to the teeter, but has responsivity vectors arranged with a greater radius of curvature so that surface R swings about axis A.

A twisting transducer layer may be assembled as a mosaic of fitted pieces, each piece having a predetermined uniform magnitude and uniform direction of responsivity, the fit of the mosaic pieces being prescribed to provide the desired responsivity of the whole mosaic. Mosaic twisting layers are thus made using established art and methods. However, the mosaic method, while simplifying the distribution of responsivity in electrodeformable material, greatly complicates the assembly of layers, and resulting layers have reduced but not eliminated internal stresses at mosaic piece boundries during activation.

The preferred methods of making twisting transducers combine predetermined configurations of responsivity vectors, predetermined configurations of applied electrical signal vectors, and means of adjusting responsivity vectors that were not initially arranged in a desired manner.

FIG. 20 is a perspective drawing of a typical twisting transducer segment at an intermediate stage of manufacture wherewith body B is given a predetermined distribution of responsivity by a combination of incident energy and material M, the process ending when surface R has the prescribed response to an applied electric signal. The energy and material M has a distribution that is determined by the particular type of twisting transducer. During manufacture of axially symmetric transducers, body B is rotated about an axis, for example, axis A. An off-axis transducer requires rotation of body B about an axis that is perpendicular to and intersects surface R, is perpendicular to and is outside surface R, is parallel to and is contained by surface R, and is parallel to and is outside surface R, or combinations thereof in accordance with the requirements of the particular transducer. In general, the axis of body rotation will be located at a distance from the axis about which transducer action proceeds. Each embodiment of twisting transducer will require a particular combination of energy-material activation rate, intensity, direction, and body rotation during the manufacturing process.

By way of example, a twisting transducer is made by epitaxially depositing shear material with a controlled rate of deposition and an angle of incidence of deposition as the body is rotated that results in the desired twisting transduction.

Controlled epitaxial deposition of twisting transducer bodies includes rotation of the deposition source about a predetermined axis while the transducer remains stationary.

Another method of effecting the rotationally active transducer is the deposition or compaction of transducer material with a first responsivity distribution, and subsequently altering the first distribution to a desired second distribution by altering the vectors with an externally applied curvilinear influence. By way of example, the twister of FIG. 16 is first made with an annular arrangement of equal-magnitude responsivity vectors, after which an external means of responsivity vector magnitude reduction is applied to reduce responsivity with distance as the rotational axis is approached, finally ending on the axis with zero responsivity magnitude. External means include a radial thermal gradient due to a heated area on the axis of minimum responsivity, a radially scanned radiation source with progressively varied intensity, a slow spirally scanned radiation source with progressively varied intensity, progressive demagnetization, and progressive depolarization by a scanned source of electric charge. The external vector adjustment means may be stationary while the transducer is rotated, and alternatively, the vector adjustment means may be scanned or otherwise rotated while the transducer remains stationary. The responsivity adjustment method may be visualized by considering M of FIG. 20 as the adjustment means.

Twisting transducer motions achieved by aforedescribed methods are due to predetermined arrangements of responsivity vectors, while the applied electrical signal has remained uniform in intensity distribution and not necessarily directly contributing to twisting transducer action.

In another class of methods of making twisting transducers, the electrical signal applied to the transducer body is not uniform but has an intensity that varies in a prescribed manner, such as, as a function of distance from a specified axis. For example, a piezoelectric shear twister transducer is first made with an annular distribution of equal-magnitude responsivity vectors, a distribution that would cause excessive internal strain and excess strain near the axis of arrangement when activated by uniform electrical signal intensity. Subsequent to the arrangement of the constant magnitude responsivity vectors, an electrode is applied that has electrical resistivity that varies monotonically with distance from the prescribed axis, having maximum resistivity at the axis and minimum resistivity at the extremes of the transducer body. A potential applied to the less resistive outer portion of the electrode will elicit greater response from the periphery of the transducer due to higher charge density, than electrode portions nearer the axis, thereby producing the desired amount and distribution of twisting transducer action.

It is emphasized that applied curvilinear electrical signals acting in combination with uniform (but curvilinear) responsivity vectors will achieve equivalent rotary transductions. However, in a subset of the embodiments of the present invention, generation of curvilinear electrical signals, for example, curved electric fields, may be less convenient, or may have insufficient strength to achieve the desired transducer actions alone.

In another subset of embodiments, nonuniform electrical signals, for example, potential gradients, and—equivalently for other transducer materials—nonuniform current densities, are included in the scope of the present invention as contributors to, and alternatively, as sole instigators of relatively contention-free twisting transduction.

A twister transducer is fabricated by a combination of: controlled vector magnitude distribution; by controlled magnitude adjustment; and by application of a controlled spatial or areal intensity distribution of the electrical signal.

A diverse class of twisting transducers of the present invention includes composites of the previously described transducers. However, the -morph forms of the aforedescribed transducers are preferred by dint of the facility with which segment -morphs (segmorphs) can be assembled without recourse to insulating layers, while maintaining electrically independent addressability of each segmorph.

FIG. 21 is a perspective view of a representative embodiment of a composite transducer having two tangenters and a twister, or the -morph equivalents. This transducer positions surface R with rectilinear translations Tr1 and Tr2 by tangenters, rotation T1 by twister or twismorph, and the action T2 of the torsier or tormorph by cooperative activation of all segments. Each transducer segment is independently electrically addressable, and is activated by a separate electrical signal. The stroke of the composite transducer is the sum of the strokes of the segments, each segment stroke being mechanically independent (excepting generally negligible electromechanical coupling) of the other segments. Off-axis rotation is resolvable into the motional components of one pure rotation and two translations. For example, a torsion stroke T2 resolves to an increment of twist T1, an increment of radial adjustment Tr2, and a tangential increment Tr1. Replacing a torsier or tormorph with the action-equivalent transducer of FIG. 21 provides a greater positioning range because each segment relegates the entirety of its range to a single motion. In addition to providing two perpendicular linear translations and a pure rotation, the composite transducer also provides any other complex motion that is resolvable into these motional components. Activating the segments with selected electrical signals provides torsier action about axis A2, controls the location of axis A2 about axis A1, controls the distance D between A1 and A2, and even provides complex noncircular motion about a moving torsier axis A2. The range of D is electrically controllable from zero to infinity.

FIG. 22 is a perspective view of a representative embodiment of a composite transducer having a lifter, a tangenter, and a teeter, or the segmorph equivalents.

This transducer positions surface R with translation Tr1 by lifter, translation Tr2 by tangenter, and rotation T1 by teeter. This composite transducer also provides the action T2 of the swinger or swingmorph by coordinated activation of all segments. Each transducer segment is independently electrically addressable, and is activated by a separate electrical signal. The stroke of the composite transducer is the sum of the strokes of the segments, each segment stroke being mechanically independent (excepting generally negligible electromechanical coupling) of the other segments. Off-axis rotation is resolvable into the motional components of one pure rotation and two translations. For example, a swinging stroke T2 resolves to an increment of teeter T1, an increment of radial adjustment Tr1, and a tangential increment Tr2. Replacing a swinger or swingmorph with the action-equivalent transducer of FIG. 22 provides a greater positioning range because each segment relegates the entirety of its range to a single motion. In addition to providing two perpendicular linear translations and a pure rotation, this composite transducer also provides any other complex motion that is resolvable into these motional components. Activating the segments with selected electrical signals provides swinger action about axis A2, controls the location of axis A2 about axis A1, controls the distance D between A1 and A2, and even provides complex noncircular motion about a moving swinger axis A2. The range of D is electrically controllable from zero to infinity.

Figure 23:
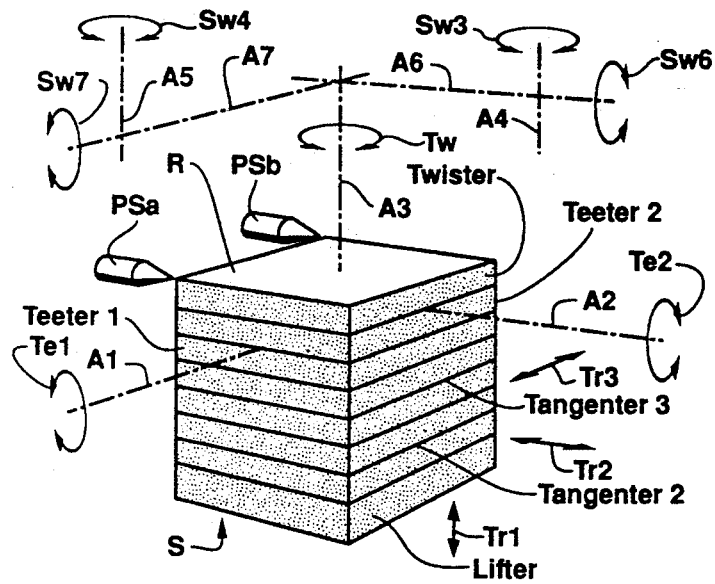
FIG. 23 is a perspective view of a stack of transducer segments having a lifter, two tangenters, two teeters, a twister and position sensors included to constitute a complex accelerometer.

FIG. 23 is a perspective view of a composite transducer that forcefully positions surface R relative to surface S with six degrees of freedom, and in a sense, with greater than six degrees of freedom by dint of the aforementioned ability of the composite twisting transducer to relocate axes of rotation during positioning about those axes. This example composite transducer includes, but is not limited to, a lifter, two tangenters, two teeters, and a twister. The "morph" form of each segment is used where needed to provide independent electrical addressability. The lifter and tangenters provide orthogonal linear motions Tr1, Tr2, and Tr3 of surface R, while the three twisting segments provide three rotations Te1, Te2, and Tw. When six distinct electrical signals of predetermined relative strengths are applied to the segments, virtual axis twists, for example, Sw3, Sw4, Sw6, and Sw7 are produced.

The term actuator is herein applied to transducers of the present invention in accordance with the convention that separates transducers, devices generally but not exclusively associated with converters of one form of electrical signal to another form of electric signal, from transducers acting as actuators that are generally but not exclusively associated with devices that convert electrical signals to useful mechanical work.

Figure 24:
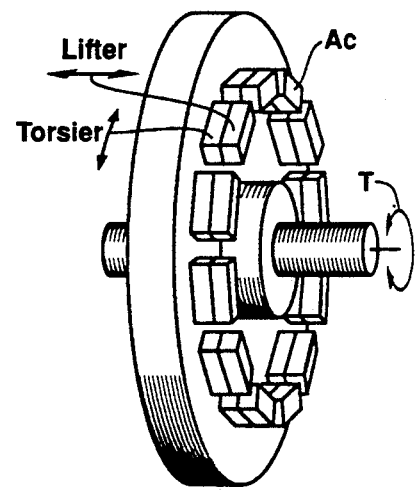
FIG. 24 is a perspective view of a motor comprising a disk with a hub shaft and twelve twisting actuators.

FIG. 24 is a perspective view of a motor comprising a disk with hub shaft and twelve like twisting actuators designated Ac. The structure supporting the actuators by their reference surfaces (S in other figures) is omitted for clarity. Each actuator Ac includes a lifter and a torsier, and alternatively, a lifter and a tormorph, depending on the requirements for electrical independence of segmorphs. Application of predetermined separate electrical signals to the torsier and the lifter result in a walking action of each leg. "Shoes" of actuators are held proximate the plane surface of the disk. Walking actuators alternately activated in at least two groups cause the disk to rotate by the traction of shoes of the walking actuators. The lifter of each actuator applies the normal tractive force to the disk surface. The torsier applies a rototranslatory force along a path that is a circular arc segment. Many actuator steps combine smoothly to rotate the disk in directions T. It is stressed that two-segment actuators, each composed of a lifter and a linear tangenter, will rotate the disk, but with life and mechanical efficiency that are reduced by the twist sliding between the shoes and the disk surface. It is also stressed that any combination of a finite number of linear motions is incapable of smooth walking a rotating surface.

A variant of the disk motor of FIG. 24 is a rotating cylinder motor (not illustrated) having a cylindrical support means that holds two or more pairs of walking actuators proximate the surface of the rotating cylinder, or shaft. This type of walking motor may use a variety of compound twisting transducer embodiments. For example, the actuator of FIG. 22 has a lifter, a tangenter, and a teeter (or their segmorphs) that forcefully walk the cylindrical surface of the shaft alternately in two or more groups. The coordinated action of the tangenter and teeter produce a succession of rototranslatory traction steps of the shaft while maintaining the shoes in full contact. The tangenter and teeter can be replaced by a swinger or its segmorph equivalent with the loss of the flexibility to relocate the electromechanical axis of rotation by changing input electrical signals. Relocation of the axis of rotation is appropriate in applications in which differential thermal expansion alters the geometry of the device incorporating actuators of the present invention.

Figure 25:
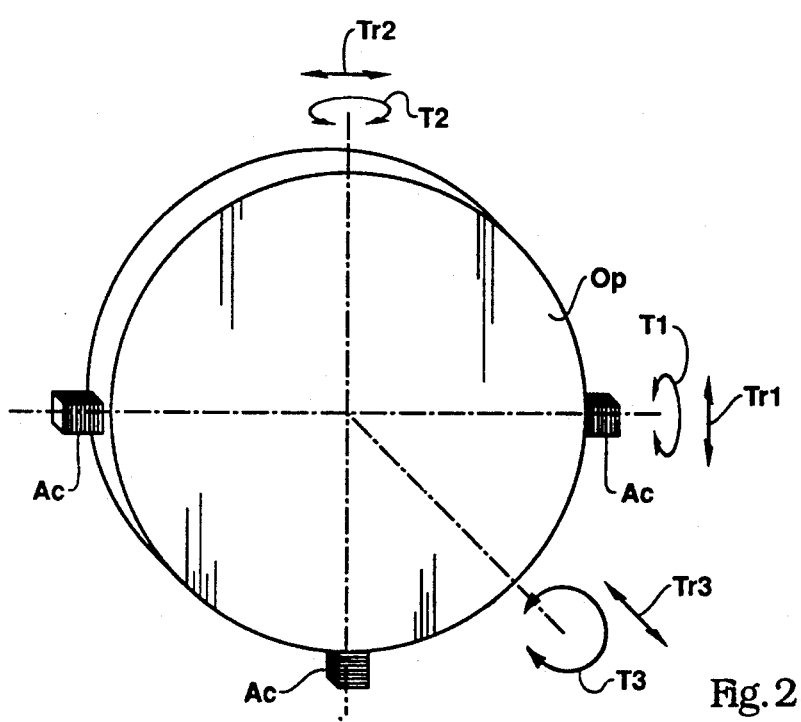
FIG. 25 is a perspective view of an optical element having twisting actuators.

FIG. 25 is a perspective view of an optical element designated Op to which three compound twisting actuators Ac are attached. Element Op is positioned by traction between the shoes of actuators and the surfaces of a support structure (omitted for clarity). Each actuator Ac may be of the six degree of freedom type, for example, the twisting actuator of FIG. 23. The actuators provide electrical control of element Op about three rotational directions T1, T2, and T3, and about three translational directions Tr1, Tr2, and Tr3. The transducers are shown positioned along perpendicular axes for clarity. An elevation of Op by swinging of the bottom actuator also requires twisting of the two side actuators. In preferred optical practice the three actuators are generally equally spaced around the edge of element Op, requiring plexiform actuator activation with all motion that includes any rotation. Each segment of each actuator is independently electrically addressable, allowing the electrical summing of rotation and translation signals applied to the actuator set to provide complete positioning of optical element Op. Alternatively, additional actuator segments provide mechanical summing of complex motions of the element while each respective electrical signal contains only the information needed for a single motion. The latter method advantageously simplifies the generation and control of activating electrical signals in a diverse class of applications of the present invention.

A further advantage of independent translations and rotations is the compensation for changes in the morphology of a device due to stress relaxation, differential thermal expansion, and related causes of changing stress or strain. The twisting transducer maintains an electrically predetermined pressure and torque of contact, leaving the positioned object, for example the optical element, in a known state of stress at all times. A diverse class of optical elements are known to retain a desirably high accuracy of optical figure when the same state of stress, including both pressure and torsion, obtains during use of the element as when the element was given its fine figure in the laboratory. Coarse positioning of element Op may be achieved by the actuators Ac shown when a sudden stroke is generated by one or more of the transducers, causing a momentary release and retracing of positioning traction force. A succession of such traction and retracting strokes positions Op to the extent available from the traction surface of the actuator support structure (omitted for clarity), a range of positions generally far greater than the positioning achieved by only traction stroke portions.

A variant of the suspension by transducer of FIG. 25 uses two actuators in place of each actuator Ac shown in the figure. Each pair of actuators walk the support surface (omitted for clarity), thereby providing coarse positioning of Op over a distance substantially greater than achieved by a single stroke. The teeters and torsiers of the actuators Ac keep the shoes in firm full-area contact with the support surfaces. Walking, particularly when the preferred nonsinusoidal activation means are used, proceeds with greatly reduced rubbing, an advantage in harsh environments such as high vacuum, and in devices where it is important to prolong life by reducing wear.

Optical and other mechanical applications of the twisting actuator include linkages that are fixed, that is, need not provide coarse positioning by traction-release or walking action. All known links of prior art rely on some combination of bending and rolling to provide compliance in bending and rotational directions. Such links are not solid and therefore, due to bending portions, or due to the compliance of Hertzian (sphere-plane) or linear (cylinder-plane) contacts, are substantially less rigid than a link of the same size that is essentially solid. The suspension and positioning of any object generally entails a series connection of mechanically compliant elements. A soft element will render the entire suspension soft regardless of the stiffness of the other elements. The solid link constituted by the twisting compound actuator provides a positionable suspension that is as rigid as permitted by the size of, and the solid material used in the link. The link complies with the changes of an object's position to minimize strain in the object, but the link does not have compliance in the conventional sense. A twister transducer link that is rigid and complies, is contrasted with a conventional link that is compliant and therefore not rigid.

Twisting transducers are usable in non-actuator applications wherein a useful function accrues directly from the electromechanical properties of the transducers. A diverse class of electric signal conditioning devices commonly referred to as transducers, include but are not limited to resonators, modulators, reactors, transformers, and the like. The twisting action of the transducers of the present invention affords an advantage of higher energy density in comparison to transducers using mechanical actions other than twisting. Well known torsional resonators use relatively complex electrical connections and cuts of crystals to achieve desired performance. Known torsional resonators generally resonate in torsion about a long axis of the transducer body, a resonance mode that generally provides relatively low resonance frequencies, and therefore lower energy density. The twister embodiment with simple planar electrodes resonates torsionally about its shortest and most rigid direction, namely, through the thickness of the layer. This mode of resonance generally provides a relatively high resonance frequency, and therefore higher energy density. Higher energy density allows a relatively more rapid reduction of transducer size when resonance frequency is raised, than non-twisting transducers. Equivalent variants of the resonator use the other aforedescribed embodiments of the present invention.

Known signal processors and filters using surface acoustic waves (SAW) are generally arranged to propagate waves along essentially straight paths. The arrangement of the responsivity vectors of twisting transducers, particularly the twister and twismorph, allows propagation of waves in a wide variety of paths. Paths may be circular, slow and fast spirals, branching, trunking, partially terminated, and the like. The methods of arranging responsivity vectors herein described, although couched in terms of the arrangements that best suit electromechanical transducers, are well suited to essentially any arrangement appropriate to SAW devices, provided the constraints of a surface and of slowly varying parameters are observed.

Throughout the Detailed Description the term piezoelectric is meant to encompass a diverse class of electrodeformable materials, including: intrinsically piezoelectric material that does not require polarizing (also called poling); ferroelectric material that requires poling; electrostrictive materials (some of which are self poling); state-change materials that undergo a change of state at the crystalline or molecular level; and the like. Included are all materials of this class responding to the application of an electric signal entailing a combination of current and potential. In addition to shear, it will be clear to those versed in the associated arts that the transducer actions herein described are generally achieved using combinations of other transducer deformations, for example, thickness and extension piezoelectric deformations.

Transducers of the present invention further include but are not limited to materials having properties of magnetic, magnetostrictive, thermal, and crystalline slip planes (also called "shape memory"), wherein an electrically induced deformation due to these properties manifests itself primarily as shear.

Transducers of the present invention, excluding those of FIGS. 3 through 6, are fabricable in sheet form with plane surfaces. Composites are easier and less expensive to make from sheets than from singly- or compound-curved layers of FIGS. 3 through 6. Flat sheets may be stacked and bonded, and alternatively, integrally fabricated without regard to precisely matching the curvature of two segments during proximation. Compound transducers like those of FIGS. 3 through 6 require a different radius for each layer.

The cylmorph of FIG. 4 may be made by joining, and alternatively, integrally fabricating two or more cyliers of FIG. 15 at a common broad surface. The responsivity vectors of one body segment are generally the reversed mirror image of the vectors of the other segment, albeit in this case all vectors of the -morph body follow the cylindrical form. The directions of action and responsivity may be parallel, may be antiparallel, and alternatively, may be angularly disposed to each other and to the direction of the applied electrical signal. When the cylmorph is made of piezoelectric material, two electrodes are replaced by a common central active electrode interior to the body, the outer electrodes being grounded.

The spherical body shape of the spherier or sphermorph of FIG. 6 permits assembly between concentric spherical walls that are more closely space than otherwise possible with an equivalent parallelepiped transducer. Two spheriers may be assembled together, and alternatively, may be integrally fabricated with a common broad interface that, with the addition of insulating layers, provides two independently electrically controllable rotations about a common point, thereby constituting movement about a spherical surface relative to some point within the sphere. Insulators are not required when the transducers are assembled proximate electrically nonconducting material, and when the -morph forms are used.

An embodiment of the twismorph of FIG. 8 is made by joining, and alternatively integrally fabricating two twister segments of FIG. 16 by a common broad surface, wherein the arrangement of responsivity vectors of one segment is generally the reversed mirror image of the vectors of the other segment. When the twismorph body is made of shear material, the intermediate surface is made the common interior electrical connection, while external connections remain grounded. A twismorph of piezoelectric shear material has a potential applied to the common electrode that creates antiparallel electric fields in the two body segments that interact with the reversed mirror image responsivity vectors, resulting in mechanical twisting strokes in the same sense in each segment. Thus, the stroke portions contributed by the segments are added and manifest themselves as the whole transducer twisting stroke at surface R.

An embodiment of the tormorph of FIG. 10 is made by joining, and alternatively integrally fabricating two torsier segments of FIG. 17 by a common broad surface, wherein the arrangement of responsivity vectors of one segment is generally the reversed mirror image of the vectors of the other segment. When the tormorph body is made of shear material, the intermediate surface is made the common interior electrical connection, while external connections remain grounded. A tormorph of piezoelectric shear material has a potential applied to the common electrode that creates antiparallel electric fields in the two body segments that interact with the reversed mirror image responsivity vectors, resulting in a mechanical twisting stroke in the same sense in each segment. Thus, the stroke portions contributed by the segments are added and manifest themselves as the whole transducer twisting stroke at surface R.

An embodiment of the teemorph of FIG. 12 is made by joining, and alternatively integrally fabricating two teeter segments of FIG. 18 by a common broad surface, wherein the arrangement of responsivity vectors of one segment is generally the reversed mirror image of the vectors of the other segment. When the teemorph body is made of shear material, the intermediate joining surface is made the common interior electrical connection, while external connections remain grounded. Potential applied to the common electrode causes antiparallel electric fields in the two body segments that interact with the reversed mirror image vectors therein, resulting in mechanical rotating strokes in the same sense. Thus, the stroke portions contributed by the segments are added. When transducer bodies are made of shear materials, the magnitudes of the stroke contributions need not be equal because each segment is essentially mechanically independent.

An embodiment of the swingmorph of FIG. 14 is made by joining, and alternatively integrally fabricating two swinger segments of FIG. 19 by a common broad surface, wherein the arrangement of responsivity vectors of one segment is generally the reversed mirror image of the vectors of the other segment. When the swingmorph body is made of shear material, the common joining surface is made the common interior electrical connection, while external connections remain grounded. Electric potential applied to the common electrode causes antiparallel electric fields in the two body segments that interact with the reversed mirror image vectors therein, resulting in mechanical action as previously described.

Forceful positioning may incur forces of any magnitude and in any direction. Construction of the composite transducer of FIG. 21 is entirely of stacked rectangular parallelepipeds. Many materials used for constructing twisting transducers sustain compressive and shear operating loads relative to the broad responsive surface. The shape of the transducer of FIG. 21 is adjusted to more capably bear shear loads when positioning with forces essentially parallel to and near surface R. The transducer of FIG. 22 is shaped to best bear body shear loads accuring from forceful twist positioning about axis T, while the transducer of FIG. 23 will accept loads from many directions simultaneously. When a transducer body becomes large as measured between surfaces R and S, and large relative to the extent of its supported surface S, known means of ameliorating body tension near S due to beam bending are supplied, a representative means being springs that compress the transducer body perpendicular to surface R.

Composite transducers used in opposed pairs, such as walking transducers, disk motors, cylinder motors, linear actuators and the like, generally supply the necessary compressive preload normal to the positioned body's surface. The shape of the transducer body is adjusted so that the overturning moment due to tangential force and body height, is always smaller than the erecting moment due to normal force and supported surface width in the direction of tangential force, thereby avoiding body tension under the least advantageous conditions of high tangential force and low normal force. A trapezoid or pyramidal body shape is preferred to foster operating stability. These shapes are also preferred because portions of the actuator that endure the greatest accelerations and are the least massive portions, and thereby reduce the force contributed by inertial reaction during high speed activation. The short cantilever beam constituted by the actuator body will more closely resemble a constant shear stress beam when the body is trapezoidal or pyramidal. The trapezoidal or pyramidal shapes are known to sustain greater loads with less deflection than a beam of the same weight and length but with a uniform body cross section. Transducer bodies of equivalent load bearing capability have a lower volume when tapered. A lower volume generally allows higher energy density of operation with a given state of internal body stress and predetermined power handling capabilities of an electrical drive means. In the example piezoelectric embodiments of the twisting transducers, a reduced volume entails a lower electrical capacitance, which in turn requires a reduced quantity of circulated reactive electrical power to perform a given amount of mechanical work.

The transducer of FIG. 23 is composed of sheets or slabs of transducer material that may best sustain operating compressive forces in a downward direction parallel to axis A3, and alternatively, may best sustain shear forces parallel to surface R and bending forces relative to surface S, in accordance with the particular operating conditions of the transducer and with the nature of the material from which the transducer body is made.

The twisting actuator in the motor of FIG. 24 provides an improvement in mechanical efficiency of forceful positioning by providing essentially uniform pressure over the entire area of contact between transducer shoes and the disk. In contrast, known actuators rely on contact between a portion of a sphere and a plane (Hertzian contact). Such contacts are relatively less rigid and less capable of bearing large forces than contacts having distributed contact area. Other known actuators rely on the contact of a cylinder and a plane, for example, tangential rolling action on a cylindrical motor shaft. While more rigid and stronger than the sphere-plane contact, the line of contact between a cylinder and a plane is still not as rigid or as strong as a full area contact of uniform pressure. Known actuators using toothed positioning surfaces benefit from the distributed engagement provided by twisting actuators because no subset of the engaged teeth bears the entire force of positioning an object, but all teeth share the forces essentially equally. Load sharing in toothed actuators is particularly advantageous when teeth are numerous and relatively small, for example, in piezoelectric toothed actuators.

The inherent rigidity of the twisting transducer provides substantial accuracy to mechanical devices such as robotic joints, optical elements, linear and rotary actuators and motors, generators (when transducer segments are electromechanically reciprocal), and the like. Rigidity, absence of sliding, combined with distributed engagement allows walking twisting transducers to operate with relatively high mechanical efficiency in deleterious environments such as intense ionizing radiation, chemical activity, and the hard vacuum of space. Uniform foot pressure reduces the tendency of materials to weld, interdiffuse, or submit to stress corrosion and cracking. Absence of sliding also reduces these tendencies, while further removing wear and fatigue from the list of known life shortening mechanisms that heretofore required relatively frequent replacement of machine components.

The preferred electric drive means applies electrical signals that are nonsinusoidal and have waveforms appropriate to smooth walking of the positioned object. Smooth walking is herein defined as forceful positioning in a walking manner that is completely free of rubbing, and mechanical power is smoothly delivered to a positioned object. Transducers of the present invention are inherently electrically segmented. In addition, each segmorph is easily further segmented to allow electric drive by the preferred method of Fourier stimulation, as described in the applicant's copending application Ser. No. 07/488,548, wherein each subsegmorph is separately electrically stimulated to resonate electrically (but not necessarily to resonate electromechanically) responsive to a corresponding one of a set of signals, each signal having a sinusoidal frequency, amplitude, phase and polarity appropriate to the action desired of the actuator. This preferred drive means provides the high electrical efficiency of electrical resonance, while also providing the high mechanical efficiency gained by the aforedescribed improvements of the present invention. The high electrical and mechanical efficiencies provide a high device system efficiency.

The composite transducer of FIG. 23 constitutes a complex accelerometer when supported surface S of the elastic bodied transducer is fixed to a rigid object that undergoes complex acceleration. When surface S is accelerated, the masses of the portions of the transducer body cause inertial reaction forces that deform body portions. A linear acceleration may cause a normal deformation, a shear deformation, or a compound deformation in accordance with the direction of the linear acceleration relative to the plane of surface S. An angular acceleration will deform the transducer body torsionally. A complex combination of linear and rotary accelerations deforms the composite transducer body in a complex manner. The electrical signals generated in each of the six transducer portions, three for shear deformations sensitive to linear accelerations, and three for twisting deformations sensitive to angular accelerations, are used to determined the magnitudes and directions (vectors) of the six acceleration components. In the more general case where accelerations are not aligned to primary directions of deformational sensitivity of the transducer, the set of six signals generated by the transducer are easily treated algorithmically to separate the six components of acceleration with respect to any one of a large number of possible predetermined coordinate axes.

A more sensitive and accurate composite accelerometer obtains when a composite transducer, for example, the transducer of FIG. 23, is used in conjunction with position sensors PSa, PSb, that are supported by mountings (omitted) to the same rigid means that supports transducer surface S. The preferred position sensors are quantum tunneling electrodes that provide an electrical signal consisting of an electron tunneling current that is a function of the gap between each electrode and a corresponding proximate transducer body surface portion. In an exemplary mode of use, the separate electric potential applied to each of the six portions of the transducer maintains a predetermined constant value of tunneling current flowing in each of the position sensors, while at rest in inertial space, and when subjected to any combinations of three angular and three linear accelerations.

As a (simplified) representative example, a linear acceleration of surface S parallel to axis A2 (FIG. 23) elicits an inertial reaction force parallel to axis A2 that elastically shears the transducer body in direction Tr2. As a result, the tunneling currents of the position sensors PSa and PSb change by a minute amount, the minute current change causes the electrical source to alter the potential in the corresponding Tangenter 2 transducer portion in direction Tr2 by a minute amount, until the body shape is electrically restored to the shape it had at rest, as indicated by a return of the tunneling currents to their predetermined corresponding at-rest values. Previous elastic and dynamic calibration of the transducer body deformations with known forces, including corresponding electrical responses, allows, in this simplified example, use of the potential applied to the Tangenter 2 body portion as an accurate measure of the linear acceleration.

In another (simplified) representative example, a rotary acceleration about axis A3 (FIG. 23) elicits a twisting inertial reaction deformation in direction Tw. As a result, the tunneling currents of position sensors PSa and PSb differ by a minute amount, the minute current difference causes the electrical source to alter by a minute amount the potential supplied to the corresponding Twister transducer portion in direction Tw until the body shape is electrically restored to the rest shape, as indicated by a return of the tunneling current difference to its predetermined rest value. The potential applied to the Twister body portion is therefore usable, in this simplified example, as an accurate measurement of the angular acceleration. Additional position sensors (omitted for clarity) provide deformation tunneling current signals corresponding to the other possible inertial reaction motions of responsive surface R or other appropriate body surface portions. Each body portion may have independent position sensors in embodiments that reduce the electromechanical coupling directly. Variants may have position sensors integrally fabricated with the transducer body or with each body portion. The integrally fabricated sensors may be an electrically separated portion of a lamina with its own electrical connection.

In practical 6-axis accelerometer embodiments of the present invention, the electrical and mechanical coupling between transducer body portions is unambiguously removed using six transfer functions having, as a group, six or fewer unknown parameters. A relatively simple computation, iterable in near-real-time, provides three twisting and three linear acceleration vectors referenced to an arbitrarily chosen coordinate system coincident with, offset from, or rotated relative to the principal coordinates of the transducer body.

An advantage of maintaining a constant elastic state of the transducer body by electrically nullifying accelerative elastic deformation is the exclusion of the temporal and spatial nonlinearity due to transducer body strain from the electromechanical transfer functions. The constant-zero-strain condition of the transducer body allows unambiguous computational correction of electrical transducer nonlinearities inherent in any real transducer. Another advantage of the zero-strain condition is the elimination of the need to compensate for the inherent nonlinear dependence of the magnitude of the tunneling current on electrode gap. A further advantage of the present invention used as the basis of a 6-axis accelerometer is that accelerations, either linear or angular, in either sense, are accommodated by the bidirectional transduction provided by bipolar electric activation of respective linear and twister elements by means of shear, particularly piezoelectric shear.

The sensitivity of 6-axis accelerometer embodiments of the present invention extends to the bounds determined solely (excluding Brownian agitation of the solid state) by the accuracy and sensitivity of the electrical components used in conjunction therewith. Transducer body deformation measurements by tunneling sensors are practiced on the order of a small fraction of an Angstrom unit ($\exp(-10)$ meter). These deformations may require a few tens of microvolts to maintain the zero-strain state. The range of accelerations measurable by the accelerometer embodiment of the 6-axis twisting composite transducer includes accelerations corresponding to the range of tens of microvolts to hundreds of volts, the correspondence determined by the scale and configuration of the particular transducer.

It will be evident to those versed in the particular arts that compound accelerometer embodiments of the present invention include but are not limited to subsets of the 6-axis transducer, including all combinations of shear and twister portions integrally fabricated, collocated, and alternatively, dispersed throughout an apparatus. An advantage of distributed accelerometer portions is a reduction of the degree to which transductions electromechanically couple, thereby simplifying the computation of separate components of linear and angular acceleration. A disadvantage of dispersing transducer elements throughout an apparatus is the admixture of the responses and coupling of the intervening supporting structure with the accelerative information.

The 6-axis accelerometer embodiment of the present invention, when made in small sizes with the preferred epitaxial methods, can be made many at a time and therefore at low cost. These embodiments provide small accelerometers with small masses and concomitant deformations appropriate to the small sensing range of the preferred tunneling electron position sensors. The small size provides high resonance frequency, high frequency response, and relatively great resistance to breakage due to shock and excess acceleration. The small size also decreases transducer body segment capacitance, thereby reducing the instantaneous electrical power needed to operate at a predetermined high frequency. Additionally, small size is a benefit to the generally cramped spaces of spacecraft, weaponry, and aerospace devices.

Obviously, many modifications and variations of the present invention are possible in light of the above teachings. It is therefore to be understood that, within the scope of the appended claims, the invention may be practiced otherwise than as specifically described.

What I claim is:

1. A transducer comprising,
one lamina of electrodeformable material having two broad surfaces in parallel planes, one being the output surface and the other being the stationary surface, responsivity vectors, and connections receptive of electric power attached to the lamina, wherein power is transduced by said vectors to forcible rotation of said output surface in its plane and the converse.

2. A transducer as in claim 1 wherein the responsivity vectors are distributed such that the responsive surface rotates without distortion.

3. A transducer as in claim 1 wherein the responsivity vectors are annularly distributed about a point, the responsivity magnitude varying as a function of the radial distance from said point.

4. A transducer as in claim 1 wherein the responsivity vectors are annularly distributed about an axis perpendicular to and through the broad surfaces, the responsivity magnitude varying as a function of the radial distance from said axis.

5. A transducer as in claim 1 wherein the responsivity vectors are annularly distributed about a point, the responsivity magnitude being constant as a function of the radial distance from said point and the electric influence varying as a function of the radial distance from said point.

6. A transducer as in claim 1 wherein the responsivity vectors are annularly distributed about an axis perpendicular to and through the broad surfaces, the responsivity magnitude being constant as a function of the radial distance from said axis and the electric influence varying as a function of the radial distance from said axis.

7. A transducer as in claim 1 wherein the responsivity vectors are annularly distributed about a point, the responsivity magnitude varying as a function of the radial distance from said point and the electric influence varying as a function of the radial distance from said point.

8. A transducer as in claim 1 wherein the responsivity vectors are annularly distributed about an axis perpendicular to and through the broad surfaces, the responsivity magnitude varying as a function of the radial distance from said axis and the electric influence varying as a function of the radial distance from said axis.

9. A transducer as in claim 1 wherein the connection receptive to electric power is an electrode placed on the output surface and on the stationary surface.

10. A transducer as in claim 9 wherein two like kind lamina are stacked having a common electrode between them, the lamina having like surfaces attached to the common electrode.

11. A transducer as in claim 10 wherein the responsivity vectors are annularly distributed on a radius about an axis which is perpendicular to the broad surfaces and through the center of the lamina.

12. A transducer as in claim 10 wherein the responsivity vectors are annularly distributed on a radius about an axis which is perpendicular to the broad surfaces, said axis being a distance from the body of the lamina.

13. A transducer as in claim 1 wherein the responsivity vectors are annularly distributed on a radius about an axis which is perpendicular to the broad surfaces and through the center of the lamina.

14. A transducer as in claim 1 wherein the responsivity vectors are annularly distributed on a radius about an axis which is perpendicular to the broad surfaces, said axis being a distance from the body of the lamina.

15. A transducer comprising one lamina of electrodeformable material, in the shape of a cylinder section having two broad surfaces, one being an output surface on the inside radius of the cylinder section and the other being a stationary surface on the outside radius of the cylinder section,
   responsivity vectors annularly distributed on a radius about the axis of the cylinder,
   and connections receptive of electric power attached to the lamina, wherein power is transduced by said vectors to forcible rotation of said output surface about the cylinder's axis and the converse.

16. A transducer as in claim 15 wherein the connections receptive to electric power are electrodes placed on the output surface and on the stationary surface and two like kind lamina are stacked having a common electrode between them, the lamina having like surfaces attached to the common electrode.

17. A transducer comprising one lamina of electrodeformable material, in the shape of a spheric section having two broad surfaces, one being an output surface on the inside radius of the spheric section and the other being a stationary surface on the outside radius of the spheric section,
   responsivity vectors annularly distributed on a radius about the center of the sphere,
   and connections receptive of electric power attached to the lamina, wherein power is transduced by said vectors to forcible rotation of said output surface on the inside radius of the sphere's axis and the converse.

18. A transducer as in claim 17 wherein two like kind lamina are stacked having a common electrode between them, the lamina having like surfaces attached to the common electrode.

19. A transducer comprising,
   one lamina of electrodeformable material having,
   two broad surfaces in parallel planes, one being the output surface and the other being the stationary surface,
   responsivity vectors annularly distributed on a radius about an axis which is parallel to the broad surfaces, said axis being a distance from the body of the lamina and said responsivity vectors causing said output surface to teeter about an axis parallel to the responsivity axis laying on the output surface,
   and connections receptive of electric power attached to the lamina, wherein power is transduced by said vectors to forcible teetering of said output surface about said axis laying on said output surface, relative to said stationary surface.

20. A transducer as in claim 19 wherein the connection receptive to electric power is an electrode placed on the output surface and on the stationary surface and two lamina are stacked having a common electrode between them.

21. A transducer comprising,
   one lamina of electrodeformable material having,
   two broad surfaces in parallel planes, one being the output surface and the other being the stationary surface,
   responsivity vectors annularly distributed on a radius about an axis which is parallel to the broad surfaces, said axis being a distance from the body of the lamina and said responsivity vectors causing said output surface to move about on the radius from said axis,
   and connections receptive of electric power attached to the lamina, wherein power is transduced by said vectors to forcible movement of said output surface about said axis.

22. A transducer as in claim 21 wherein the connection receptive to electric power is an electrode placed on the output surface and on the stationary surface and two like kind lamina are stacked having a common electrode between them, the lamina having like surfaces attached to the common electrode.

23. An actuator comprising a stack having a lifter comprising a transducer body of electrodeformable material having two broad surfaces in parallel planes, one being the output surface and the other being the stationary surface, responsivity vectors, and connections receptive of electric power attached to the transducer body, wherein power is transduced by said vectors to forcible translation of said output surface perpendicular to the stationary surface and the converse,
   and a twister, comprising one lamina of electrodeformable material having two broad surfaces in parallel planes, one being the output surface and the other being the stationary surface, responsivity vectors annularly distributed on a radius about an axis which is perpendicular to the broad surfaces and through the center of the lamina, and connections receptive of electric power attached to the lamina, wherein power is transduced by said vectors to forcible rotation of said output surface in it's plane and the converse.

24. An actuator comprising a stack having a lifter comprising a transducer body of electrodeformable material having two broad surfaces in parallel planes, one being the output surface and the other being the stationary surface, responsivity vectors, and connections receptive of electric power attached to the transducer body, wherein power is transduced by said vectors to forcible translation of said output surface perpendicular to the stationary surface and the converse, and a torsier, comprising comprising one lamina of electrodeformable material having two broad surfaces in parallel planes, one being the output surface and the other being the stationary surface, responsivity vectors annularly distributed on a radius about an axis which is perpendicular to the broad surfaces, said axis being a distance from the body of the lamina, and connections receptive of electric power attached to the lamina, wherein power is transduced by said vectors to forcible rotation of said output surface in its plane and the converse.

25. An actuator comprising a stack having a lifter comprising a transducer body of electrodeformable material having two broad surfaces in parallel planes, one being the output surface and the other being the stationary surface, responsivity vectors, and connections receptive of electric power attached to the transducer body, wherein power is transduced by said vectors to forcible translation of said output surface perpendicular to the stationary surface and the converse, and a tangenter comprising a transducer body of electrodeformable material having two broad surfaces in parallel planes, one being the output surface and the other being the stationary surface, responsivity vectors, and connections receptive of electric power attached to the transducer body, wherein power is transduced by said vectors to forcible translation of said output surface parallel to the stationary surface and the converse, and a teeter comprising, one lamina of electrodeformable material having, two broad surfaces in parallel planes, one being the output surface and the other being the stationary surface, responsivity vectors annularly distributed on a radius about an axis which is parallel to the broad surfaces, said axis being a distance from the body of the lamina and said responsivity vectors causing said output surface to teeter about an axis parallel to the responsivity axis laying on the output surface, and connections receptive of electric power attached to the lamina, wherein power is transduced by said vectors to forcible teetering of said output surface about said axis laying on said output surface, relative to said stationary surface.

26. An actuator comprising a stack having a lifter, comprising a transducer body of electrodeformable material having two broad surfaces in parallel planes, one being the output surface and the other being the stationary surface, responsivity vectors, and connections receptive of electric power attached to the transducer body, wherein power is transduced by said vectors to forcible translation of said output surface perpendicular to the stationary surface and the converse, at least two tangenters each comprising a transducer body of electrodeformable material having two broad surfaces in parallel planes, one being the output surface and the other being the stationary surface, responsivity vectors, and connections receptive of electric power attached to the transducer body, wherein power is transduced by said vectors to forcible translation of said output surface parallel to the stationary surface and the converse, the lifter and tangenters are oriented such that they all act perpendicular to each other when activated, a twister comprising one lamina of electrodeformable material having two broad surfaces in parallel planes, one being the output surface and the other being the stationary surface, responsivity vectors annularly distributed on a radius about an axis which is perpendicular to the broad surfaces and through the center of the lamina, and connections receptive of electric power attached to the lamina, wherein power is transduced by said vectors to forcible rotation of said output surface in it's plane and the converse, and at least two teeters each comprising, one lamina of electrodeformable material having, two broad surfaces in parallel planes, one being the output surface and the other being the stationary surface, responsivity vectors annularly distributed on a radius about an axis which is parallel to the broad surfaces, said axis being a distance from the body of the lamina and said responsivity vectors causing said output surface to teeter about an axis parallel to the responsivity axis laying on the output surface, and connections receptive of electric power attached to the lamina, wherein power is transduced by said vectors to forcible teetering of said output surface about said axis laying on said output surface, relative to said stationary surface, the twister and teeters are oriented such that they all rotate on axes perpendicular to each other when activated, so that an actuator can move and position an object with six degrees of freedom.

27. An actuator comprising a stack having a twister comprising one lamina of electrodeformable material having two broad surfaces in parallel planes, one being the output surface and the other being the stationary surface, responsivity vectors annularly distributed on a radius about an axis which is perpendicular to the broad surfaces and through the center of the lamina, and connections receptive of electric power attached to the lamina, wherein power is transduced by said vectors to forcible rotation of said output surface in its plane and the converse, and at least two tangenters each comprising a transducer body of electrodeformable material having two broad surfaces in parallel planes, one being the output surface and the other being the stationary surface, responsivity vectors, and connections receptive of electric power attached to the transducer body, wherein power is transduced by said vectors to forcible translation of said output surface parallel to the stationary surface and the converse, the twister and tangenters are oriented such that they all rotate on axes perpendicular to each other when activated.

28. A motor comprising a disk with a hub shaft, an actuator having a lifter comprising a transducer body of electrodeformable material having two broad surfaces in parallel planes, one being the output surface and the other being the stationary surface, responsivity vectors, and connections receptive of electric power attached to the transducer body, wherein power is transduced by said vectors to forcible translation of said output surface perpendicular to the stationary surface and the converse, and a torsier, comprising one lamina of electrodeformable material having two broad surfaces in parallel planes, one being the output surface and the other being the stationary surface, responsivity vectors annularly distributed on a radius about an axis which is perpendicular to the broad surfaces, said axis being a distance from the body of the lamina, and connections receptive of electric power attached to the lamina, wherein power is transduced by said vectors to forcible rotation of said output surface in its plane and the converse, a housing for supporting the actuator wherein said actuator is disposed adjacent to said disk at a radius from the shaft, whereby the torsier acts at a radius matched to the radius the actuator is positioned from the shaft, whereby said actuator engages the disk and provides an angular force to said disk, a controller connected to the actuator to activate the actuator.

29. A motor as in claim 28 wherein there are position sensors in each lamina of the actuator which send position information to the controller.

30. A motor as in claim 28 wherein the actuator engages said disk, applies a force to said disk, disengages from said disk, and retraces its motion to begin another cycle.

31. A motor as in claim 30 wherein the actuator engages and disengages said disk without rubbing.

32. An object positioner comprising at least three actuators, each actuator having a stack with a lifter comprising a transducer body of electrodeformable material having two broad surfaces in parallel planes, one being the output surface and the other being the stationary surface, responsivity vectors, and connections receptive of electric power attached to the transducer body, wherein power is transduced by said vectors to forcible translation of said output surface perpendicular to the stationary surface and the converse, at least two tangenters, each comprising a transducer body of electrodeformable material having two broad surfaces in parallel planes, one being the output surface and the other being the stationary surface, responsivity vectors, and connections receptive of electric power attached to the transducer body, wherein power is transduced by said vectors to forcible translation of said output surface parallel to the stationary surface and the converse, the lifter and tangenters are oriented such that they all act perpendicular to each other when activated, a twister comprising one lamina of electrodeformable material having two broad surfaces in parallel planes, one being the output surface and the other being the stationary surface, responsivity vectors annularly distributed on a radius about an axis which is perpendicular to the broad surfaces and through the center of the lamina, and connections receptive of electric power attached to the lamina, wherein power is transduced by said vectors to forcible rotation of said output surface in its plane and the converse, and at least two teeters each comprising, one lamina of electrodeformable material having, two broad surfaces in parallel planes, one being the output surface and the other being the stationary surface, responsivity vectors annularly distributed on a radius about an axis which is parallel to the broad surfaces, said axis being a distance from the body of the lamina and said responsivity vectors causing said output surface to teeter about an axis parallel to the responsivity axis laying on the output surface, and connections receptive of electric power attached to the lamina, wherein power is transduced by said vectors to forcible teetering of said output surface about said axis laying on said output surface, relative to said stationary surface, all three oriented such that they all rotate on perpendicular axis to each other when activated, so that an actuator can move and position an object with six degrees of freedom.

said actuators supported by a housing and positioned adjacent to an object which is to be moved or positioned, each actuator can move and position an object with six degrees of freedom, a controller connected to the actuators to activate the actuators.

33. A motor as in claim 32 wherein there are position sensors in each lamina of the actuator which send position information to the controller.

34. A motor as in claim 32 wherein the actuator engages said object, applies a force to said object, disengages from said object, and retraces its motion to begin another cycle.

35. A motor as in claim 34 wherein the actuator engages and disengages said object without rubbing.

* * * * *